Aug. 26, 1969 C. ROSEN 3,464,031

SINGLE TRANSISTOR OSCILLATOR-MODULATOR MULTIPLIER CIRCUIT

Filed Sept. 28, 1966 2 Sheets-Sheet 1

INVENTOR.
CHARLES ROSEN
BY
Paul + Paul
ATTORNEYS.

SINGLE TRANSISTOR OSCILLATOR-MODULATOR MULTIPLIER CIRCUIT

Filed Sept. 28, 1966 2 Sheets-Sheet 2

INVENTOR.
CHARLES ROSEN
BY
Paul & Paul
ATTORNEYS.

3,464,031

SINGLE TRANSISTOR OSCILLATOR-MODULATOR-MULTIPLIER CIRCUIT

Charles Rosen, Philadelphia, Pa., assignor to Microcom Corporation, Horsham, Pa., a corporation of Pennsylvania Filed Sept. 28, 1966, Ser. No. 582,691
Int. Cl. H03c *3/28*
U.S. Cl. 332—26 5 Claims

ABSTRACT OF THE DISCLOSURE

A modulator-oscillator-multiplier circuit having but a single active element is disclosed. The single active element is a three-element transistor, the base-emitter junction of which is biased by a D-C voltage to set the operating point of the phase modulation, and a piezoelectric crystal is connected across the base-emitter junction to control the generation of a fixed frequency oscillation signal. A capacitor is connected across the crystal to reduce the amplitude of the oscillation signal to a point where variation in the base-emitter bias will vary the internal capacitance of the base-emitter junction and will thereby cause amplitude and phase modulation of the oscillation signal. The input information is applied across the base-emitter junction of the crystal as a frequency modulated signal, each cycle of which amplitude modulates the base-emitter bias, thereby producing the desired phase modulation at the crystal frequency.

The broad purpose of the present invention is to provide a small sized transmitter.

Another purpose is to provide a small size transmitter for use in a telemetry system.

A more specific purpose is to provide a small sized crystal controlled transmitter for use in a telemetry system and which is capable of withstanding high magnitude shock, for example, of the order 20,000 G.

A still more specific purpose is to provide a crystal controlled transmitter as above which is small enough physically to be inserted into a small sized artillery shell, for example, a 20 mm. shell, and which will withstand the shock of the firing of such shell and be capable of functioning thereafter to send back signals during the flight of the shell to a ground station telemetry receiver.

These and other purposes, objects and advantages of the present invention are attained by using small sized rugged components and by reducing the number of components required to provide a crystal controlled transmitter.

More particularly, in a preferred embodiment of the crystal controlled transmitter of the present invention, three functions, namely, oscillation, modulation and multiplication, are provided by a circuit which uses only one active semi-conductor device. The use of but one active device for oscillation and multiplication is not novel, but it is novel to use but a single active device to perform the three functions of oscillation, multiplication and modulation. The type of modulation used is phase modulation. Phase modulation is desirable because it does not degrade the frequency stability of the crystal oscillator while achieving the desired modulation.

The invention will be clear from the following description taken together with the drawings in which.

It has been found desirable during test firings of artillery shells to provide at least some of the test shells with radio frequency transmitting equipment for the purpose of sending back signals to a ground telemetering receiver relating to one or more variables sensed during the flight of the shell. In many cases the telementry is used to measure the parameters of a fuse battery. In a typical case, it is desired that the transmitter send back signals on three different channels, one channel for each of three different variables sensed.

Figure 1:
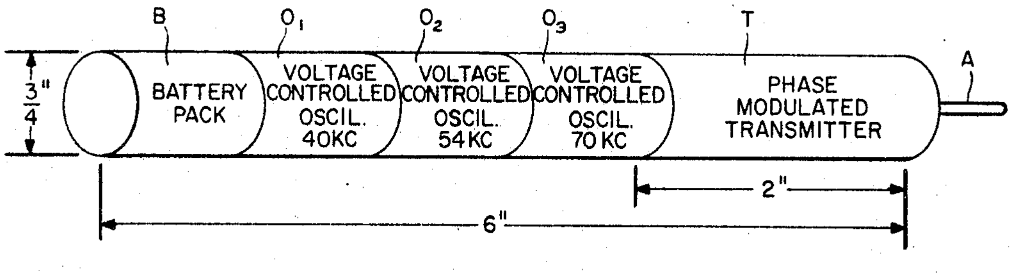
FIGURE 1 is a diagram illustrating the general physical arrangement and approximate size of one particular airborne transmitter system intended for installation inside an artillery shell having a one inch diameter and a length of about six inches, to send back telemetering signals to the ground station during test firings.

A typical three channel airborne transmitting equipment is illustrated in FIG. 1 wherein the equipment is shown to include three voltage-controlled oscillators O1, O2 and O3 operating on frequencies of 40 kc., 54 kc. and 70 kc. respectively, and supplied by a battery pack B. The output of the phase modulated transistor T is fed to an antenna A.

Figure 2:
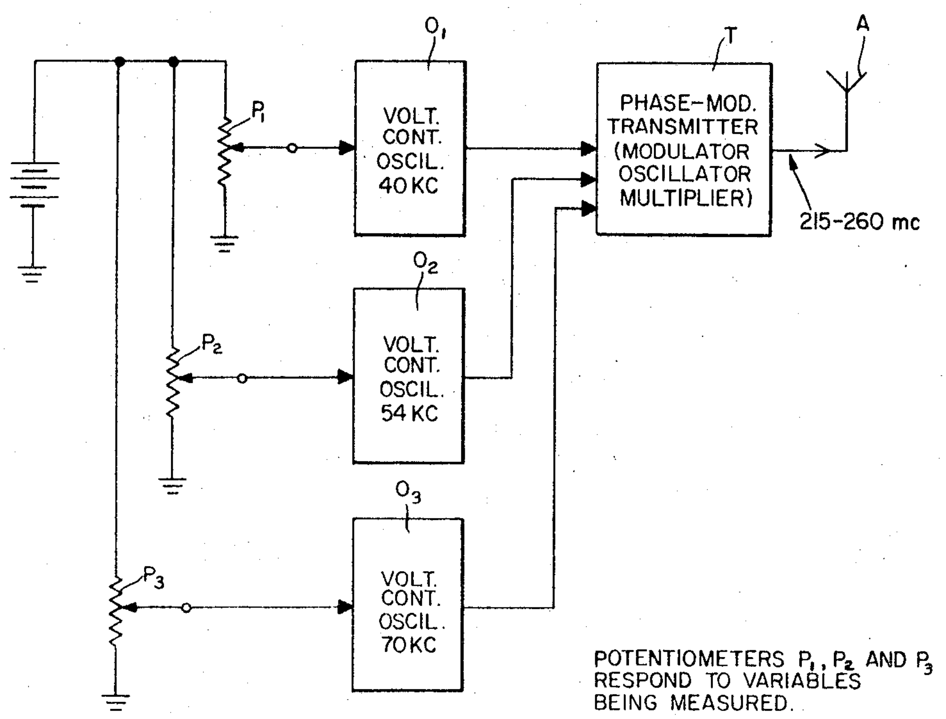
FIGURE 2 is a block diagram of the transmitter system of FIGURE 1.

FIG. 2 is a block diagram of the system of FIG. 1 and shows voltage supplied to the voltage-controlled oscillators O1, O2 and O3 through potentiometers P1, P2 and P3 respectively. The arms of these potentiometers are arranged to respond to the three variables which are to be measured, thereby frequency modulating the voltage-controlled oscillators O1, O2 and O3, at an audio rate.

The outputs of the oscillators are supplied to the phase modulated transmitter T and the output of the transmitter T is fed to the antenna A.

Figure 3:
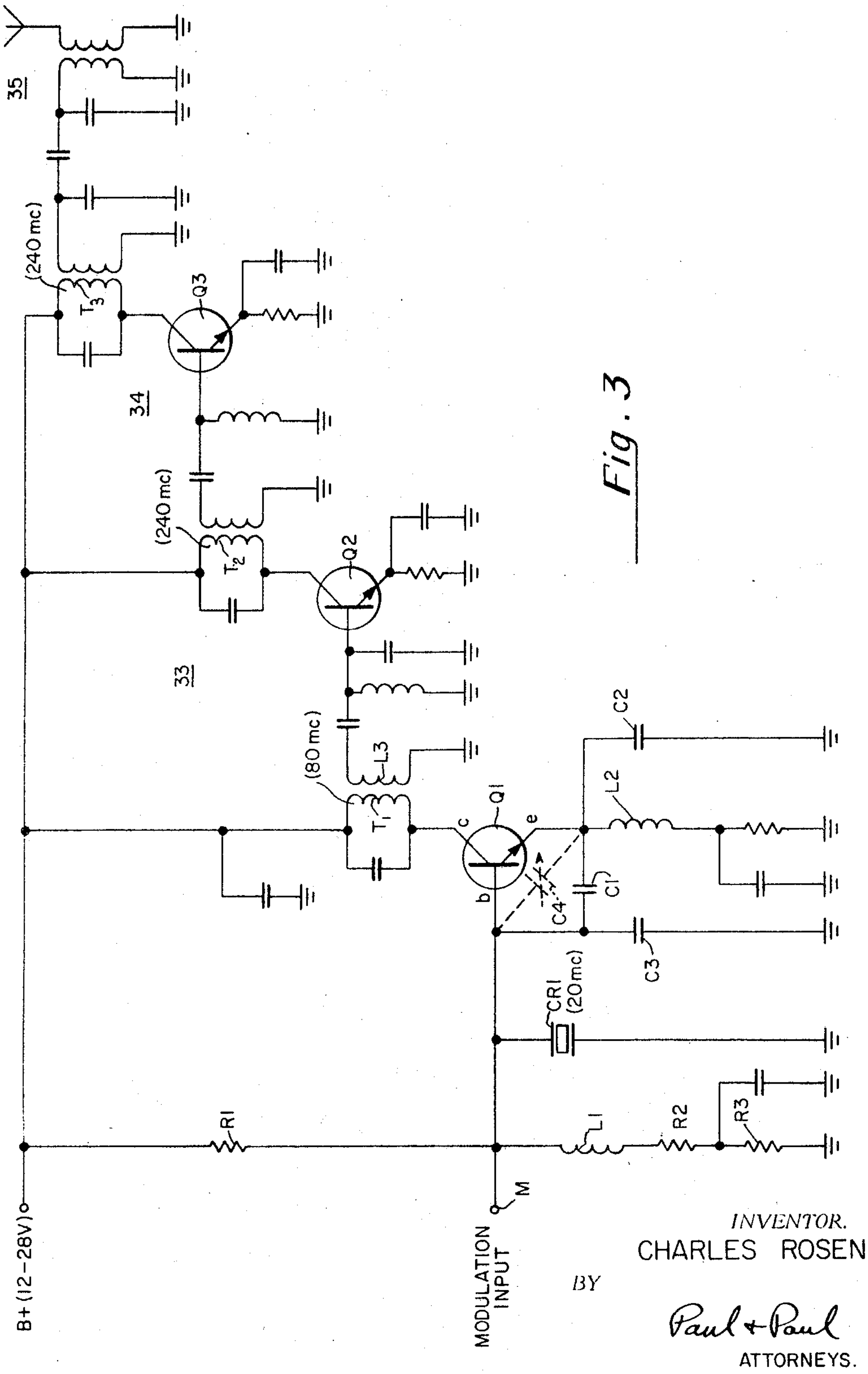
FIGURE 3 is a schematic circuit diagram of a presently preferred circuit for the phase-modulated transmitter of FIGURES 1 and 2.

FIG. 3 shows the circuit details of the phase-modulated transmitter T. The frequency-modulated signals from the oscillators O1, O2 and O3 are applied as the modulation input to the terminal M.

Included among the artillery shells desired to be so equipped with a three channel transmitter is a shell having a diameter no larger than about one inch, where the telemetry can be inserted, and a length of the order of six inches. With four inches assigned to three voltage controlled oscillators and to the battery pack, only two inches of the total length of the shell remains for the transmitter. Thus, the problem was to design a transmitter small enough in size to occupy a space not greater than one inch in diameter and approximately two inches in length. The actual transmitter measures one inch in diameter and 1¾" in length. It was further required that the transmitter be crystal controlled. It was during the efforts to provide such a small sized transmitter that the invention claimed in the present application was conceived and perfected.

It should, perhaps, be mentioned at this point that while present day micro-miniaturization techniques have been applied to a wide variety of circuits, these techniques have not been developed to the point where the power output requirements of a transmitter can be met by micro-miniaturized techniques, and particularly not a crystal controlled transmitter. An appreciable portion of the small 1" x 2" space available to the transmitter in the present case is preempted by the crystal and by the tank coil of the oscillator. A crystal designed to withstand a shock of 20,000 G, to which the shell is subjected at firing, has been developed, but no claim to such crystal is made in the present patent application.

Included among the requirements to be met are (1) that the oscillator be stable and (2) that the modulation deviation be linear. During the development work, it was found that a high-frequency crystal oscillator, for example, a 60 mc. oscillator, did not provide adequate linear deviation. It was found that to obtain sufficient linear deviation, a lower starting frequency would have to be used. The desired final frequency is 240 mc. with ±125 kc. deviation.

After continued experimentation and trial, a satisfactory small sized transmitter meeting all the requirements referred to above was discovered. A schematic diagram of this circuit is shown in FIGURE 3 of the present application.

It should be pointed out here that the claims of the present application are not directed to the entire circuit of FIGURE 3; they are directed only to that portion of the circuit in which the modulation signal is applied to modulate the crystal controlled oscillator to provide the desired modulation of the transmitted signal. This portion is believed to be novel and unique.

Stated briefly, the frequency-modulated signals from one or more of the voltage controlled oscillators O1, O2, or O3, of FIG. 2, embodying the intelligence sought to be transmitted are applied at input terminal of FIG. 3 to the crystal controlled oscillator to vary the capacity effect of the emitter-to-base junction of the oscillator transistor. The result is a circuit of one stage having but a single active device which operates as oscillator, modulator and multiplier. It is this three-function feature which is believed to be novel and unique because in effect no additional parts are required to achieve the modulation.

In the circuit of FIGURE 3, the crystal CR1 is assumed to be a 20 mc. crystal. The basic oscillator circuit shown in FIGURE 3 is the common collector version of a Pierce cystal oscillator in which crystal CR1 controls the frequency of oscillation. The active element in the oscillator circuit is the transistor Q1 which is shown in FIGURE 3 to be an NPN type. The circuit could, of course, be designed to employ a PNP type transistor. Capacitors C1 and C2 are selected to provide proper feedback voltage to sustain oscillation. Coil L2 is the R-F load at the oscillator frequency.

In the collector circuit of transistor Q1 is a tuned circuit T1 tuned to the desired harmonic of the crystal oscillator frequency. In FIGURE 3, the circuit T1 is shown tuned to 80 mc., the fourth harmonic of the fundamental crystal frequency.

Crystal CR1 operates in a parallel resonant mode. Resistors R1, R2 and R3 set the forward bias condition across the base-emitter junction of transistor Q1. Resistors R1, R2 and R3 also set the operating point for the phase modulation. This is a voltage which is the result of the diode action of the emitter-base junction of the transistor. In the drawing, *e* identifies the emitter, *b* the base, and *c* the collector. The modulation or information input signal is applied at point M. This input signal, while frequency modulated, varies the base-emitter bias during each cycle and hence varies the base-emitter junction capacity of tranistor Q1 to accomplish the desired amplitude and phase modulation of the oscillation signal developed across crystal CR1.

The phase modulation is accomplished by an amplitude to phase conversion. That is to say, by amplitude modulating the R-F signal across the crystal CR1 phase modulation is obtained. By varying a capacitance in shunt with the crystal CR1, the amplitude of the R-F signal across the crystal can be controlled. The larger the value of the shunt capacitance the smaller the amplitude of the oscillation signal, and the smaller the value of the shunt capacitance the larger the amplitude.

If two parallel capacitances are used, such as shunt capacitor C3 and the base-emitter junction capacity C4 of the transistor Q1, the variation of one or the other will cause amplitude modulation of the R-F signal, thereby achieving phase modulation. Accordingly, the present invention proposes that the value of capacitor C3 be selected to provide the opearting point on the operating voltage curve which will produce linear phase modulation and that the capacity C4 of the emitter-base junction of the transistor be varied in accordance with the modulation input signal.

The objective is to provide the proper amplitude modulation in order to obtain a linear phase deviation. To achieve this, capacitor C3 is selected for minimum value of modulation distortion. In the particular circuit illustrated in FIGURE 3, values between 4.3 and 12 micromicrofarads have been found to be appropriate for capacitor C3.

In summary, the shunt capacitance across crystal CR1 controls the A-C current vector associated with the crystal. The present invention proposes to vary this shunt capacitance across the crystal to obtain amplitude variations of the R-F signal, thereby to obtain phase modulation. The invention proposes to provide a shunt capacitor C3 of fixed value (selected by test) to select the operating point on the operating voltage curve and to develop voltage variations thereabout by varying the base-emitter junction capacitance C4 of the transistor Q1. It proposes to do this by varying the bias across the base-emitter junction by means of an applied voltage modulation signal.

After the phase modulation is accomplished, the undesired amplitude modulation is eliminated by the limiting action of the class C operated multiplier and amplifier stages.

When capacitor C3 is first connected across crystal CR1 a shift in the crystal frequency will occur, but this shift will be fixed and will be minor in nature.

In the final circuit, it is contemplated that capacitor C3 will have a fixed value which will coincide with the crystal specifications and the transistor specifications in order to achieve the proper operating point. Crystal jigs can then be made and sent to the crystal manufacturer to obtain crystals which are cut to the proper frequency. Any additional minor variations in the value of capacitor C3 to obtain better modulation distortion characteristics will not alter or shift the operating frequency beyond the acceptable tune-up tolerance limits.

Resistors R1, R2 and R3 are selected for the proper forward bias conditions of the emitter-base junction of transistor Q1 in order to obtain a linear capacity change across the junction with modulation signal. In FIGURE 3, the base-emitter junction capacity is represented by the dotted-line variable capacitor C4.

It is seen then that no additional circuits have been added to accomplish phase modulation. Heretofore, in circuits used for the same end purpose, a diode component and its associated parts, or a transistor stage and its associated parts, have been added to the oscillator and multiplier circuit to obtain phase modulation.

The circuit shown in FIGURE 3 may also be used with harmonic mode crystals, in which case the selection of capacitor C1, coil L2 and capacitor C2 will force oscillations at the desired frequency of the harmonic mode. Here again, in this type of operation, the selection of capacitor C3, and of resistors R1, R2 and R3 will determine the modulation characteristics.

The remaining portion of the circuit shown in FIGURE 3 is conventional. The modulated 80 mc. signal developed in the collector circuit of transistor Q1 is picked up by coil L3 and applied to transistor Q2 of a frequency-multiplier circuit 33 having a tank circuit T2 tuned to 240 mc. The 240 mc. signal is then amplified in an amplifier circuit 34 and applied to the antenna system 35.

What is claimed is:

1. A modulator oscillator comprising but a single active element, said active element being a transistor having a base-emitter junction; means supplying a D-C voltage bias to the base-emitter junction; means, including a crystal connected in the base-emitter circuit, for generating a fixed frequency oscillation signal in the base-emitter circuit; feedback means connected across the base-emitter junction for feeding back a portion of said oscillation signal; a fixed capacitor connected across said crystal for reducing the operating amplitude of the oscillation signal;

and means for applying an amplitude modulating input voltage signal across said crystal to vary the D-C voltage bias across the base-emitter junction of said transistor, thereby to vary the internal base-emitter capacity across said junction, and thereby to phase modulate said oscillation signal.

2. A modulator oscillator as claimed in claim 1 further characterized in that said transistor includes a collector circuit, and in that said collector circuit includes a tank circuit tuned to a harmonic of the fundamental oscillation frequency of said crystal, and output means for deriving from said tank circuit a modulated signal at said harmonic frequency.

3. A modulator-oscillator multiplier having a single active element, said active element being a transistor having a base, emitter and collector; voltage divider means for applying a D-C voltage bias across the base-emitter junction; means, including a crystal, connected in the base-to-emitter circuit of said transistor for developing an oscillation signal; capacitor feedback means connected across said base-emitter junction for feeding back a portion of the crystal oscillation signal; a fixed capacitor connected across said crystal for reducing the operating amplitude of said oscillation signal; input means for applying an amplitude modulating input voltage signal across said crystal, thereby to vary the D-C bias across said base-emitter junction to vary the internal base-emitter capacity, thereby to phase modulate said oscillation signal; a tank circuit, tuned to a harmonic of said oscillation signal, connected in the collector circuit; and output means for deriving from said collector tank circuit a modulated signal at the harmonic frequency.

4. A modulator oscillator comprising but a single active element, said active element being a transistor having input circuit terminals, output circuit terminals, and an input junction; means supplying a forward D-C voltage bias to the input junction; means, including a crystal connected in the input circuit of said transistor for generating a fixed frequency oscillation signal in the input circuit; feedback means connected across the input junction for feeding back a portion of said oscillation signal; capacitor means connected across said crystal for reducing the operating amplitude of the oscillation signal; and means for applying an amplitude modulating input voltage signal across said crystal to vary the D-C voltage bias across the input junction of said transistor, thereby to vary the internal capacity across said junction, and thereby to phase modulate said oscillation signal.

5. A modulator oscillator as claimed in claim 4 further characterized in that included in the output circuit of said transistor is a tank circiut tuned to a harmonic of the fundamental oscillation frequency of said crystal, and in that output means are provided for deriving from said tank circuit a modulated signal at said harmonic frequency.

References Cited

UNITED STATES PATENTS

| | | | |
|---|---|---|---|
| 2,703,387 | 3/1955 | Dutton | 332—26 |
| 2,866,162 | 12/1958 | Rosen et al. | 332—26 X |
| 3,007,045 | 10/1961 | Paynter | 331—116 X |
| 3,026,488 | 3/1962 | Lister et al. | 332—26 |
| 3,227,968 | 1/1966 | Brounley | 332—26 |

ALFRED L. BRODY, Primary Examiner

U.S. Cl. X.R.

325—105; 331—23, 73, 116; 332—30